United States Patent [19]
Abe

[11] Patent Number: 5,698,889
[45] Date of Patent: Dec. 16, 1997

[54] OPTICAL ELEMENT MOUNTED ON A BASE HAVING A CAPACITOR IMBEDDED THEREIN

[75] Inventor: Takato Abe, Tokyo, Japan

[73] Assignee: Oki Electric Industry Co., Ltd., Tokyo, Japan

[21] Appl. No.: 662,148

[22] Filed: Jun. 12, 1996

Related U.S. Application Data

[60] Division of Ser. No. 328,259, Oct. 24, 1994, Pat. No. 5,567,972, which is a continuation-in-part of Ser. No. 147,489, Nov. 5, 1993, abandoned.

[51] Int. Cl.$^6$ .............................. G02B 6/30; G02B 6/42
[52] U.S. Cl. ...................... 257/434; 385/88; 385/92; 257/924
[58] Field of Search ........................ 257/433, 434, 257/924, 91–92; 385/92, 76, 88; 250/239

[56] References Cited

U.S. PATENT DOCUMENTS

| | | | |
|---|---|---|---|
| 3,292,135 | 12/1966 | Robinson | 257/710 |
| 4,307,934 | 12/1981 | Palmer | 257/433 |
| 4,650,285 | 3/1987 | Stevenson | 257/434 |
| 4,868,711 | 9/1989 | Hirama et al. | 361/321 |
| 4,954,877 | 9/1990 | Nakanishi et al. | 257/698 |
| 5,177,670 | 1/1993 | Shinohara et al. | 257/700 |
| 5,542,018 | 7/1996 | Kuhara et al. | 385/92 |

FOREIGN PATENT DOCUMENTS

| | | | |
|---|---|---|---|
| 641957 | 5/1962 | Canada | 257/710 |
| 57-68088 | 4/1982 | Japan | 257/433 |
| 60-258974 | 12/1985 | Japan | 257/433 |
| 2-2645 | 1/1990 | Japan | 257/434 |
| 2125214 | 2/1984 | United Kingdom | 257/433 |

*Primary Examiner*—Jerome Jackson
*Assistant Examiner*—John Guay
*Attorney, Agent, or Firm*—Rabin, Champagne & Lynt, P.C.

[57] ABSTRACT

An optical device is disclosed which comprises a base including a lower cylindrical base member having a common central line and a first diameter and having top and bottom surfaces, a first electrode layer formed on the top surface of the lower base member, a dielectric layer formed on the first electrode, a second electrode layer formed on the dielectric layer, and an upper base member formed on the second electrode layer, the upper base member including a first cylindrical member having the common central line and the first diameter and having top and bottom surfaces, the bottom surface of the first cylindrical member faced on the second electrode layer and a second cylindrical member having the common central line and a second diameter smaller than the first diameter and having a top surface and a bottom surface faced on the top surface of the first cylindrical member; elongated leads supported by the base, the leads being elongated so as to protrude from the bottom surface of the lower base member; a ring-shaped flange formed on the top surface of the first cylindrical member of the upper base member, the ring-shaped flange protruding from a side surface of said base; a conductive pattern formed on the top surface of the second cylindrical member of the upper base member, said conductive pattern electrically coupled to the leads; and a photo diode mounted on the center of the top surface of the second cylindrical member of the upper base member.

20 Claims, 3 Drawing Sheets

OPTICAL ELEMENT MOUNTED ON A BASE HAVING A CAPACITOR IMBEDDED THEREIN

CROSS REFERENCE TO RELATED APPLICATIONS

This is a Division of application Ser. No. 08/328,259, filed Oct. 24, 1994, now U.S. Pat. No. 5,567,972, which is a continuation-in-part of prior application Ser. No. 08/147,489, filed Nov. 5, 1993, now abandoned.

BACKGROUND OF THE INVENTION

This invention relates to an optical device, and more particularly to an optical device where optical elements such as light-receiving and light-emitting elements are mounted in a header having a capacitor imbedded therein.

A conventional light-receiving element with a signal amplifying element is one of a type wherein a mount plate is disposed on an upper portion of a cylindrical and metal frame body. Further, leads are welded to the mount plate. Then, an eyelet and the mount plate are held together by a carbon jig and glass is melted under a high temperature and poured into the frame body. Thereafter, the glass poured into the frame body is sealed and fixed.

Each of the frame body, the mount plate and the leads is substantially identical in expansion coefficient to the glass.

A PIN photo diode (which corresponds to a diode serving as a light-receiving element wherein an I layer is interposed between P and N layers), an amplifying element (amplifier) and a power-noise removing chip capacitor are mounted on the mount plate by bonding. These components are electrically connected to each other by aluminum wires.

FIG. 5 shows an optical device 50 which is coupled to an optical fiber 41 with a holder 43. The optical fiber 41 is fixed in the center of the holder 43 with a cylindrical case 42 which is fixed by adhesive material 44. The optical device 50 is fixed into a recess portion of the holder 43 by adhesive material 45. A PIN photo diode (not shown in FIG. 5) is mounted on the center of the optical device 50. Since the recess portion of the holder 43 is formed so that a cap (a head portion) of the optical device 50 can be inserted without alignment, the optical fiber 41 and the PIN photo diode are optically aligned.

Although the PIN photo diode is mounted on the center of a header of the optical device, the center of the header may not be coincident with the center of the cap because there is some clearance between them.

Further, when the eyelet and the mount plate are held together by the carbon jig and the glass is molten under the high temperature and poured into the frame body, expansion/shrinkage occurs due to the difference in thermal expansion coefficient (carbon: $a=3.3 \times 10^{-6}$ and glass: $a=48 \times 10^{-7}$) between the carbon jig, the eyelet and the mount plate, thereby causing a positional displacement of the mount plate. When the PIN photo diode is mounted to the mount plate in a state in which the positional displacement has occurred in the mount plate, a problem arises that a displacement or shift of about ±0.2 mm occurs in the PIN photo diode.

In addition, since the distance between the above components which are to be connected to each other by the aluminum wires is long, a parasitic LC oscillating circuit is made up of the total capacitance (C) of an optical device and the total reactance (L) of the aluminum wires, so that the amplifier oscillates.

SUMMARY OF THE INVENTION

It is an object of the present invention to provide an optical device capable of providing less positional displacement upon mounting a photo diode.

It is another object of the present invention to provide an optical device of a type wherein a parasitic LC oscillating circuit is not formed.

It is further object of the present invention to provide an optical device which can be optically aligned with an optical fiber correctly.

An optical device of the present invention comprises a base, elongated leads, a ring-shaped flange, a conductive pattern and a photo diode.

The base includes a lower cylindrical base member, a first electrode layer, a dielectric layer, a second electrode layer and an upper base member. The lower cylindrical member has a common central line and a first diameter and has top and bottom surfaces. The first electrode layer is formed on the top surface of the lower base member. The dielectric layer is formed on the first electrode. The second electrode layer is formed on the dielectric layer. The upper base member is formed on the second electrode layer. The upper base member includes a first cylindrical member having the common central line and the first diameter and having top and bottom surfaces, the bottom surface of the first cylindrical member faced on the second electrode layer and a second cylindrical member having the common central line and a second diameter smaller than the first diameter and having a top surface and a bottom surface faced on the top surface of the first cylindrical member. The elongated leads are supported by the base. The leads are elongated so as to protrude from the bottom surface of the lower base member. The ring-shaped flange is formed on the top surface of the first cylindrical member of the upper base member. The ring-shaped flange protrudes from a side surface of the base. The conductive pattern is formed on the top surface of the second cylindrical member of the upper base member and electrically coupled to the leads. The photo diode is mounted on the center of the top surface of the second cylindrical member of the upper base member.

DETAILED DESCRIPTION OF THE PREFERRED EMBODIMENT

Figure 1:
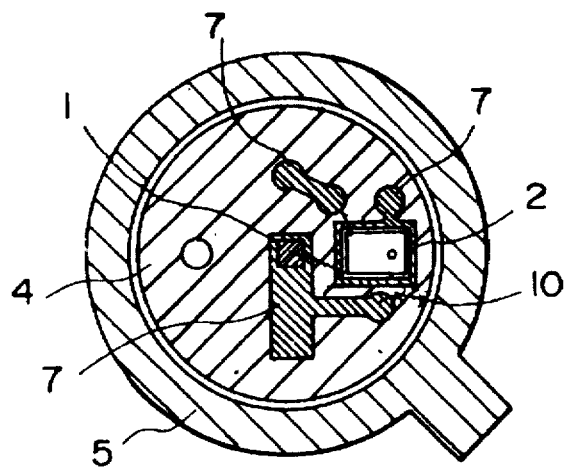
FIG. 1 is a view showing the structure of an upper surface of an optical device according to the embodiment of the present invention.

FIG. 1 shows the structure of an upper surface of an optical device according to the embodiment of the present invention. A PIN photo diode 1 and an amplifier 2 are disposed on their corresponding electrode patterns 7 which are formed on a base 4 so that the distance therebetween is brought to the minimum. The PIN photo diode 1 and the amplifier 2 are electrically connected to each other by aluminum wires 10. in the present embodiment, the base 4 is made of a ceramic. More particularly, the base 4 is formed by superimposing black ceramic plates each having a thickness of about 0.4 mm in the form of a multilayer. The conductive patterns 7 are printed and formed on an upper surface of the base 4 by nickel and the surface of each of the conductive patterns 7 is subjected to Au plating. The photo diode 1 is correctly formed in the center of the upper surface of the base 4.

Figure 2:
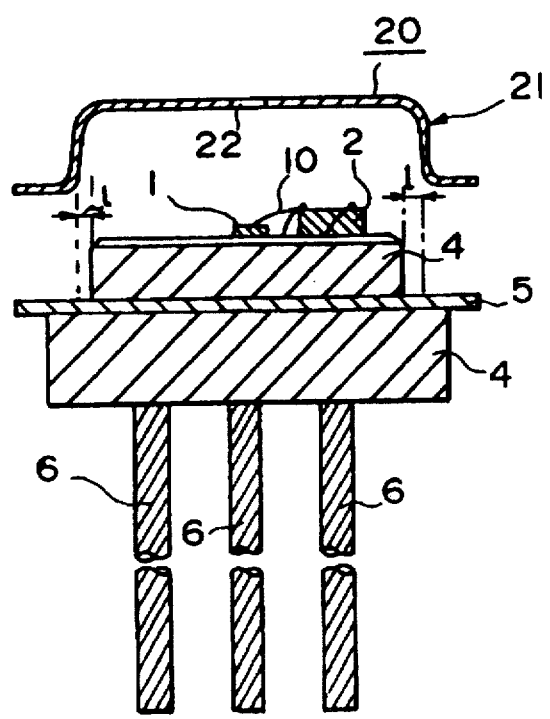
FIG. 2 is a view illustrating the structure of a side face of the optical device shown in FIG. 1.

FIG. 2 is a cross-sectional view of the structure of the optical device shown in FIG. 1. The base has a shape such that a plateau region, such as a small cylinder having a small diameter is placed on a large cylinder having a larger diameter and the same central line as shown in FIG. 2. Each of the leads 6 which is made up of an alloy of Fe, Ni and Co protrudes from the lower surface of the base 4. The surfaces of the leads 6 are subjected to nickel plating and the Au plating in that order.

The upper portion of the base 4 is covered by a cap 20. The cap 20 has a window 22 which is formed of glass, a transparent material. The window 22 pass a light so that the photo diode I can receive the light from the outside. The window 22 has an area which is large enough to pass the light to the photo diode 1 even when the cap 20 and the small cylinder of the base 4 are misaligned. The other portion 21 of the cap 20 has a flange 21a and an enclosure portion 21, and is formed of an alloy of Fe, Ni and Co and its surface is subjected to nickel plating and the Au plating in that order.

The cap 20 is joined at the flange 21a with a ring-shaped flange 5 by welding to cover the photo diode 1, the amplifier 2, the electrode patterns 7, the aluminum wires 10 and the small cylinder of the base 4. There is a margin I between the cap 20 and the small cylinder of the base 4.

The flange 5 is composed of the same material as that the leads 6. The flange 5 is placed on an upper ring surface of a larger cylinder of the base 4 and is joined with base 4 by welding. Further, the flange 5 is also subjected to the nickel plating and the Au plating in that order.

Since a power-noise removing capacitor is not provided as will be described below as in the case of a conventional example, it is possible to facilitate the layout and wiring of the capacitor and improve the accuracy of mounting it to the optical device.

Figure 3:
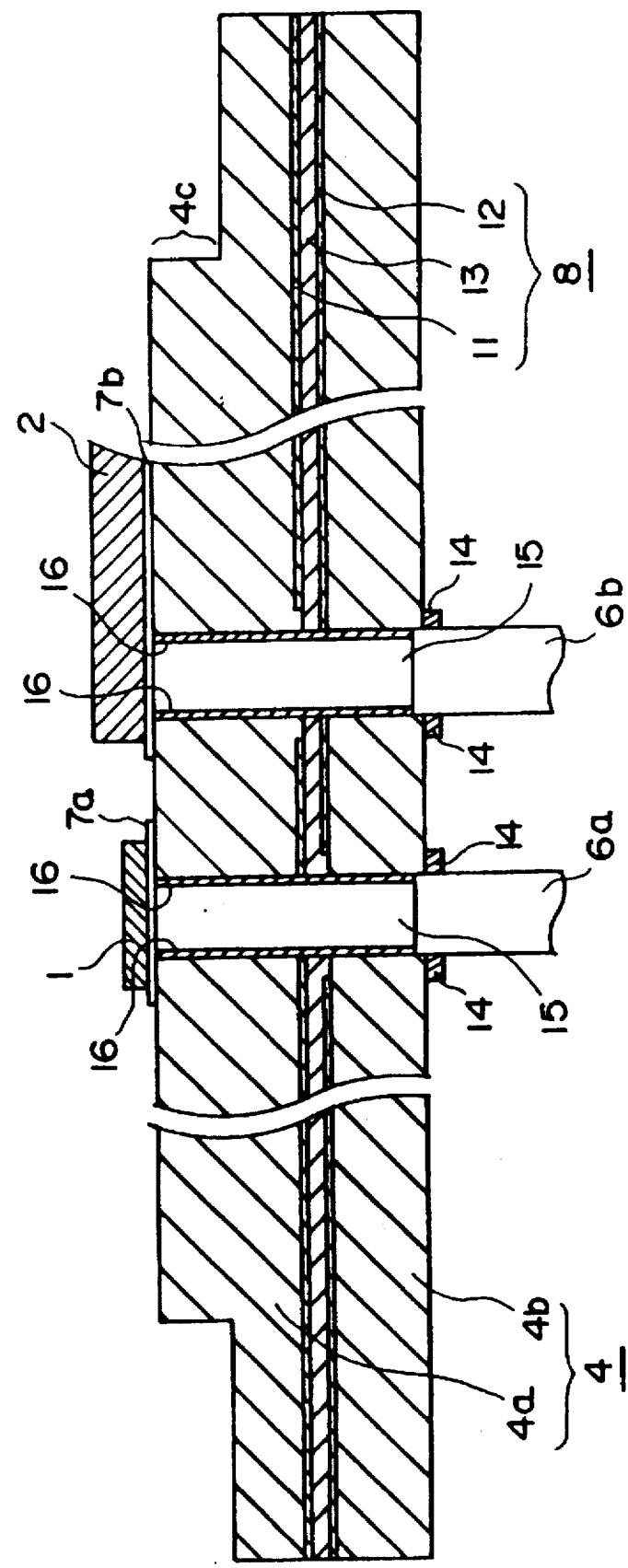
FIG. 3 is a partly enlarged cross sectional view depicting the optical device shown in FIG. 1.

FIG. 3 is an enlarged and partly omitted cross-sectional view of the present embodiment. As shown in FIG. 3, a capacitor 8 is formed within the large cylinder of the base 4 and electrically connected to patterns 7a and 7b of patterns 7 and leads 6a and 6b of leads 6.

The capacitor 8 comprises a first electrode layer 11 formed just below an upper base 4a of the base 4 by printing, a second electrode layer 12 formed on a lower base 4b of the base 4 by printing and a dielectric layer 13 formed between the first electrode layer 11 and the second electrode layer 12. The upper base 4a has a small cylinder portion 4c which has a diameter of T1 and a first large cylinder portion which has the same central line as does the small cylinder portion 4c and a diameter of T2 larger than T1. The dielectric layer 13 is formed by superimposing eight sintered ceramic plates each having a thickness of 50 μm. The first electrode layer 11 is electrically connected to the conductive pattern 7a and the lead 6a via an inner conductive pattern 16a which is formed on an inner surface of one through hole 15a. The second electrode layer 12 is electrically connected to the conductive pattern 7b and the lead 6b via the inner conductive pattern 16b which is formed on the inner surface of another through hole 15b. The lower base 4b which has a cylinder shape and the diameter T2 is formed just below the second electrode layer 12. The leads 6a and 6b are fixed to the lower base 4b by adhesive material 14.

In the present embodiment, a high voltage potential Vcc (5V) is applied to the lead 6a and thus to the conductive pattern 7a. Also, a ground voltage potential GND (0V) is applied to the lead 6b and thus to the conductive pattern 7b. The leads 6a and 6b are fixed to the lower base 4b by the conductive material 14.

A method of forming the base 4 will now be described below. A conductor, which serves as the second electrode layer 12, is printed in pattern form on the upper surface of one (lower base 4b) of a pair of ceramic raw plates (which are generally called "non sintered ceramics"), for example. A layer formed by superimposing sintered ceramics each having a thickness of 50 μm in the form of eight layers is stuck on the resultant patterned conductive layer with an adhesive. Further, a conductor, which serves as the first electrode layer 11, is printed on the lower surface of the remaining ceramic raw plate (upper base 4a). Thereafter, the two ceramic raw plates are stuck to each other with the adhesive. As a result, the capacitor 8 is formed between the two ceramic raw plates. Then, several more ceramic raw plates are superimposed on the two ceramic raw plates stuck to each other until a suitable thickness is obtained. The conductive layer printed as the pattern has hole patterns for defining through holes 15. Further, the aforementioned conductive patterns 7 are printed on the ceramic raw plate corresponding to the uppermost layer. Thus, the base 4 can be formed by sintering the layered body or board comprised of the so-formed ceramic raw plates. Thereafter the leads 6 are fixed to the base 4 by the conductive material 14. Then, the PIN photo diode 1 and the amplifier 2 are mounted on the conductive patterns 7a and 7b respectively. Finally, the aluminum wires 10 are formed to electrically connect the PIN photo diode 1 and the amplifier 2 to each other.

Figure 4:
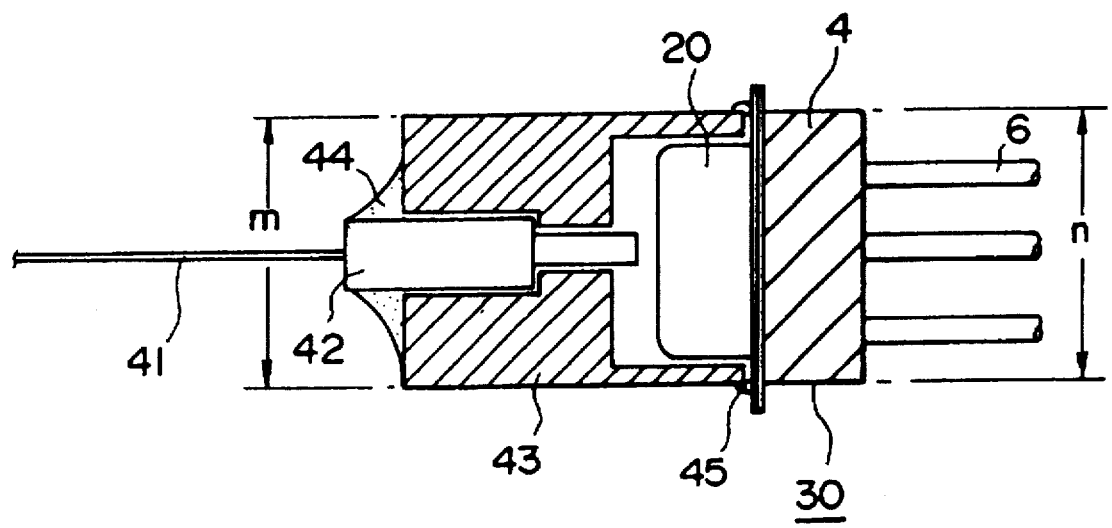
FIG. 4 is a cross sectional view showing the coupling relationship between the optical device of the present invention and a holder of an optical fiber.
Figure 5:
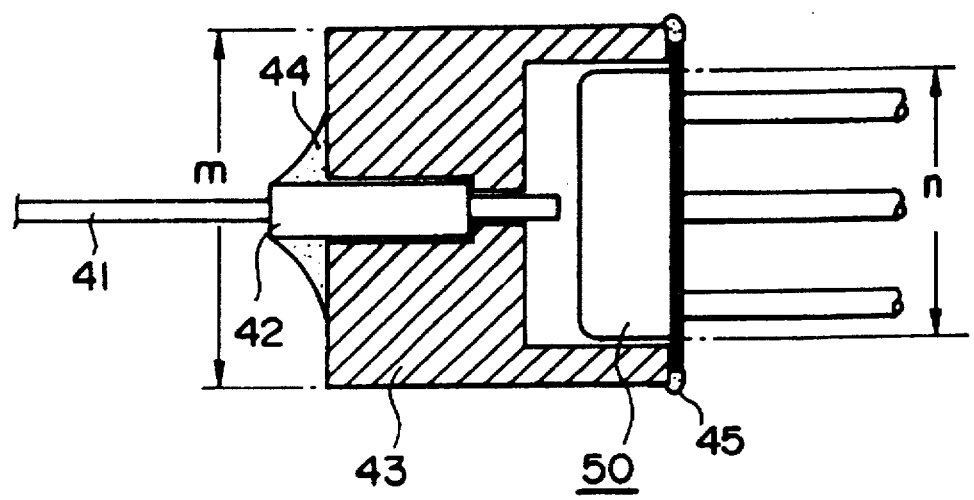
FIG. 5 is a cross sectional view showing the coupling relationship between the conventional optical device and a holder of an optical fiber.

FIG. 4 shows a coupling of an optical device 30 of the present invention and an optical fiber 41, with a holder 43 having a width. The optical fiber 41 is fixed in the center of the holder 43 with a cylindrical case 42 which is fixed by adhesive material 44. The optical device 30, which includes cylindrical base 4 having a diameter of n, is fixed at a recess portion of the holder 43 by adhesive material 45. A PIN photo diode (not shown in FIG. 4) is mounted on the center of the optical device 30.

The recess portion of the holder 43 is formed so that a cap 20 of the optical device 30 can be inserted. Since the cap 20 of the optical device and the small cylinder (not shown in FIG. 4) of the base 4 may be misaligned within the margin I as described the above, the center of the cap 20 (where the window 22 is disposed) may not be aligned with the PIN photo diode, which is correctly mounted on the center of the top surface of the small cylinder of base 4, as described the above. Therefore, if the width m of the holder 43 and the diameter n of the base 4 are perfectly aligned, the PIN photo diode and the optical fiber 41 are also aligned perfectly.

The above description has been made of a light-receiving element as an example. It is however needless to say that the present structure can be basically applied even to a light-emitting element as well as a light-receiving element or to an element serving both as a light-receiving element and a light-emitting element.

According to the present invention, as has been described above, the base of the optical device is made up of the ceramic with the capacitor incorporated therein. It is therefore possible to reduce a space for mounting circuit parts on the upper surface of a header. Further, the accuracy of mounting the circuit parts could also be reduced down to ±50 μm in the present embodiment. It is also possible to easily shorten pattern intervals between the respective elements and to reduce the lengths of the wires to be wirebonded. In the present embodiment, each wire could be reduced in length to 50 μm at a minimum. A problem about pseudo LC oscillations produced according to the length of each wire is virtually solved.

Having now fully described the invention, it will be apparent to those skilled in the art that many changes and modifications can be made without departing from the spirit or scope of the invention as set forth herein.

What is claimed is:

1. An optical fiber module, comprising:
   a base having a top side and a bottom side, the base additionally having a plateau region at its top side and an axis which runs through the plateau region, the plateau region of the base having a width that is smaller than the width of the base at its bottom side;
   an optical transducer mounted on the base at a position such that the axis of the base extends through the transducer; having a width that is greater than the width of the plateau region, the enclosure portion of the cap having a window over the transducer; and
   a holder having an axis, the holder additionally having a cavity which loosely receives the enclosure portion of the cap, the holder also having a passage which extends along the axis of the holder and which communicates with the cavity of the holder, the top side of the base having a portion protruding laterally from, the holder, the holder being in supporting alignment with the top side of the base so as to bring the axis of the holder and the axis of the base substantially into coincidence and thereby aim the passage in the holder at the transducer, the holder having a width which is substantially equal to and in alignment with the width Of the bottom side of the base.

2. An optical device according to claim 1, wherein the base has a shoulder region around the plateau region, and further comprising a flange member on the shoulder region, the flange of the cap being attached to the flange member and the holder being attached to the flange of the cap.

3. An optical device according to claim 1, further comprising first and second leads extending from the base, and wherein the base further comprises a lower base element which is made from an insulating material and an upper base element which is made from an insulating material, the plateau region of the base being provided on the upper base element, the base additionally comprising a capacitor between the upper and lower base elements, the capacitor including a first electrode layer which is electrically connected to the first lead and a second electrode layer which is electrically connected to the second lead.

4. An optical device according to claim 3, wherein the first and second electrode layers are flat and are substantially perpendicular to the base axis.

5. An optical device according to claim 4, wherein the capacitor further comprises at least one sintered ceramic layer between the first and second electrode layers.

6. An optical fiber module according to claim 1, wherein the protruding portion of the base includes a base flange, the base flange protruding from the holder, the flange of the cap being fixed to the base flange, the holder being fixed on the flange of the cap.

7. An optical fiber module according to claim 1, wherein the protruding portion of the base includes a base flange, the base flange protruding from the holder.

8. An optical fiber module according to claim 7, further comprising an adhesive fixing the holder on the flange of the cap.

9. An optical fiber module, comprising:
   a base including
      a lower cylindrical base member having a central line and a first diameter and having a top surface and a bottom surface opposite to the top surface,
      a first electrode layer on the top surface of the lower base member,
      a dielectric layer on the first electrode,
      a second electrode layer on the dielectric layer, and
      an upper base member on the second electrode layer, the upper base member including
         a first cylindrical portion having a central line identical with the central line of the lower cylindrical base member and a diameter equal to the first diameter, and having a top surface and a bottom surface opposite to the top surface, the bottom surface of the first cylindrical portion facing the second electrode layer, and
         a second cylindrical portion having a central line identical with the central line of the first cylindrical member and a second diameter smaller than the first diameter and having a top surface and a bottom surface facing the top surface of the first cylindrical portion;
   a plurality of elongated leads supported by said base, said leads being elongated so as to protrude from the bottom surface of the lower base member;
   a ring-shaped base flange on the top surface of the first cylindrical portion of the upper base member, said ring-shaped flange protruding from a side surface of said base;
   a conductive pattern formed on the top surface of the second cylindrical portion of the upper base member, said conductive pattern being electrically coupled to said leads; and
   a photo diode mounted on the center of the top surface of the second cylindrical portion of the upper base member, so that the position of the photo diode is determined by the upper base member
   a cap having a peripheral portion formed on the base flange and having an enclosure portion with a cavity which loosely receives the plateau region, the cavity having a width that is greater than the width Of the plateau region, the enclosure portion of the cap having a window over the transducer; and
   a holder having an axis, the holder additionally having a cavity which loosely receives the enclosure portion of the cap, the holder also having a passage which extends along the axis of the holder and which communicates with the cavity of the holder, the base flange protruding laterally from the holder, the holder being in supported alignment with the top surface of the first cylindrical portion of the upper base member so as to bring the axis of the holder and the axis of the base substantially into coincidence and thereby aim the passage in the holder at the transducer.

10. An optical fiber module according to claim 9, wherein the upper and lower base members are made of ceramic.

11. An optical fiber module according to claim 9, wherein each of the upper and lower base members is composed of a plurality of ceramic plates.

12. An optical fiber module according to claim 11, wherein each of the ceramic plates has a thickness of about 0.4 min.

13. An optical fiber module according to claim 9, wherein the dielectric layer is composed of a plurality of insulating ceramic plates.

14. An optical fiber module according to claim 13, wherein each of the insulating ceramic plates has a thickness of about 50 μm.

15. An optical fiber module comprising:

a first lead for applying a first voltage level;

a second lead for applying a second voltage level;

a lower cylindrical base member having a central line and a first diameter and having a top surface and a bottom surface opposite to the top surface, said lower cylindrical base member supporting said first and second leads, said first and second leads being elongated so as to protrude from the bottom surface of the lower base cylindrical member;

a capacitor on the top surface of the lower cylindrical base member, said capacitor having,
a first electrode layer on the top surface of the lower cylindrical base member, the first electrode layer being electrically coupled to the first lead,
a dielectric layer on the first electrode, and
a second electrode layer on the dielectric layer, the second electrode layer being electrically coupled to the second lead;

an upper base member on the second electrode layer, the upper base member including
a first cylindrical portion having a central line identical with the central line of the lower cylindrical base member and a diameter equal to the first diameter, and having a top surface and a bottom surface opposite to the top surface, the bottom surface of the first cylindrical portion facing the second electrode layer, and
a second cylindrical portion having a central line identical with the central line of the first cylindrical portion and a second diameter smaller than the first diameter, and having a top surface and a bottom surface facing the top surface of the first cylindrical portion;

a ring-shaped base flange on the top surface of the first cylindrical portion of the upper base member and protruding from a side surface of said upper base member;

first and second conductive patterns formed on the top surface of the first cylindrical portion of the upper base member, said first and second conductive patterns being electrically coupled to said first and second leads, respectively; and a photo diode mounted on the center of the top surface of the first cylindrical portion of the upper base member, so that the position of the photo diode is determined by the upper base member a cap having a peripheral portion formed on the base flange and having an enclosure portion with a cavity which loosely receives the second cylindrical portion, the cavity having a width that is greater than the width of the second cylindrical portion, the enclosure portion of the cap having a window over the transducer; and a holder having an axis, the holder additionally having a cavity which loosely receives the enclosure portion of the cap, the holder also having a passage which extends along the axis of the holder and which communicates with the cavity of the holder, the base flange protruding laterally from the holder, the holder being in supported alignment with the top surface of the first cylindrical portion of the upper base member so as to bring the axis of the holder and the axis of the base substantially into coincidence and thereby aim the passage in the holder at the transducer.

16. An optical fiber module according to claim 15, wherein the upper and lower base members are made of ceramic.

17. An optical fiber module according to claim 15, wherein each of the upper and lower base members is composed of a plurality of ceramic plates.

18. An optical fiber module according to claim 17, wherein each of the ceramic plates, has a thickness of about 0.4 mm.

19. An optical fiber module according to claim 15, wherein the dielectric layer is composed of a plurality of insulating ceramic plates.

20. An optical fiber module according to claim 19, wherein each of the insulating ceramic plates has a thickness of about 50 μm.

* * * * *